United States Patent [19]

Vatis et al.

[11] Patent Number: 4,736,328

[45] Date of Patent: Apr. 5, 1988

[54] APPARATUS FOR SHIFTING THE PHASE OF TRANSMITTER AND RECEIVER ANALOG BASEBAND SIGNALS IN AN NMR SYSTEM

[75] Inventors: Dimitrios Vatis, Schenectady; Charles L. Dumoulin, Ballston Lake, both of N.Y.

[73] Assignee: General Electric Company, Schenectady, N.Y.

[21] Appl. No.: 779,338

[22] Filed: Sep. 23, 1985

[51] Int. Cl.[4] .................... G01R 23/00; G01V 3/00; G05F 5/00

[52] U.S. Cl. .................................... 364/484; 324/307; 324/314; 307/511; 328/155

[58] Field of Search ................ 364/484; 324/307, 309, 324/312, 314, 310, 313; 328/155; 307/511–513

[56] References Cited

U.S. PATENT DOCUMENTS

| | | | |
|---|---|---|---|
| 4,034,191 | 7/1977 | Tomlinson et al. | 324/312 |
| 4,297,637 | 10/1981 | Crooks et al. | 324/309 |
| 4,340,862 | 7/1982 | Percival et al. | 324/312 |
| 4,424,488 | 1/1984 | Hounsfield | 324/309 |
| 4,468,621 | 8/1984 | Hinshaw | 324/309 |
| 4,471,305 | 9/1984 | Crooks et al. | 324/314 |
| 4,502,008 | 2/1985 | Ohuchi | 324/307 |
| 4,536,711 | 8/1985 | King et al. | 324/307 |
| 4,626,783 | 12/1986 | Ohuchi | 324/307 |
| 4,638,190 | 1/1987 | Hwang et al. | 307/513 X |
| 4,647,789 | 3/1987 | Upadhyayula | 307/511 X |
| 4,672,318 | 6/1987 | Sekihara et al. | 324/307 |

Primary Examiner—Parshotam S. Lall
Assistant Examiner—Joseph L. Dixon
Attorney, Agent, or Firm—Geoffrey H. Krauss; James C. Davis, Jr.; Marvin Snyder

[57] ABSTRACT

Apparatus for shifting the phase of a phase-quadrature signal pair, in at least one of the transmitter and receiver of an NMR system, uses a circuit for shifting the phase of each of the pair of signals by a substantially similar amount responsive to a control signal, and a microcontroller for programmably establishing the control signal data to provide a desired phase shift. Typically, the control signal is of digital data nature and the phase shifter operates to shift signal phase through an angle equal to a selected multiple N of a basic angle. The basic angle is selected such that a plurality of equal angle increments are established by the resolving properties of the data signal. A plurality of phase shifters can be controlled by a single microcontroller.

12 Claims, 3 Drawing Sheets

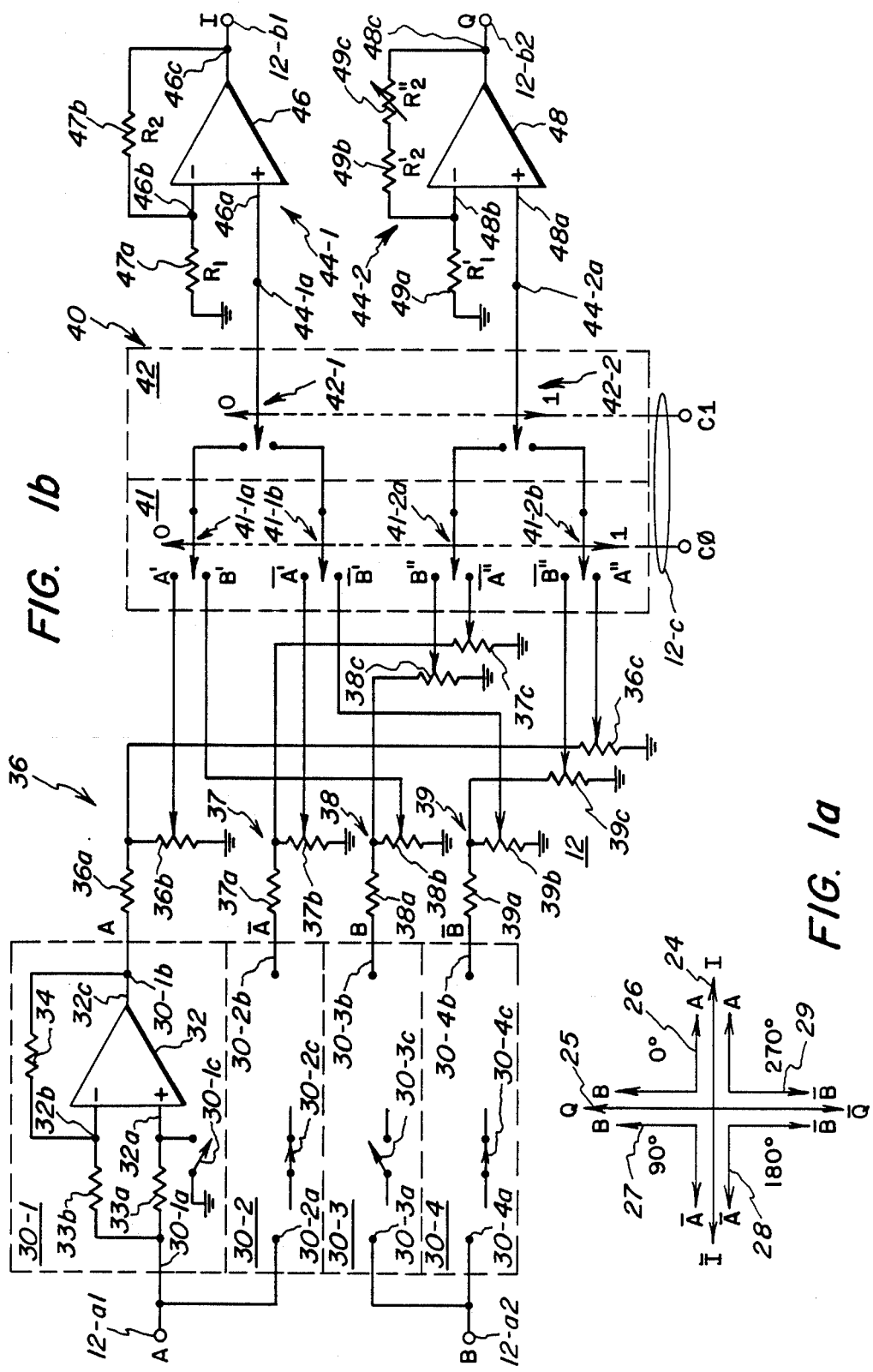

APPARATUS FOR SHIFTING THE PHASE OF TRANSMITTER AND RECEIVER ANALOG BASEBAND SIGNALS IN AN NMR SYSTEM

BACKGROUND OF THE INVENTION

The present invention relates to apparatus for shifting the phase of quadrature video signals and, more particularly, to novel video phase-shift apparatus for use in the transmitter and receiver of a nuclear magnetic resonance (NMR) imaging system.

Apparatus for providing a pair of video signals (i.e. a pair of signals having relatively low-frequency, including DC, components; sometimes referred to as "baseband" signals) with one of a plurality of discrete phases, relative to a reference phase, is often required in the medical imaging arts. One use of such apparatus is in the transmitter and receiver portions of an RF spectrometer utilized, as a part of a nuclear magnetic resonance spectrometry and imaging system, for providing a selected one of a plurality of distinct phase shifts. A number of discrete phase shifts may be needed when acquiring data from a sample in: zero-quantum and/or multiple-quantum experiments; increasing suppression of imaging artifacts; dual channel excitation control; and the like. Thus, many high-resolution NMR imaging procedures may require manipulation of the phase of either, or both, of (a) a pair of sample excitation baseband signals, determining the modulation envelope of a signal from the NMR system transmitter, and (b) a pair of sample response baseband signals, appearing as the recovered video envelope of the signal received from the sample. Therefore, it is desirable to provide precise phase control for any NMR spectrometer, and particularly in a spectrometer used for research purposes. As a minimum, the ability to shift the relative phase of each baseband video analog signal pair by a selected one of a 0°, 90°, 180° or 270° increment is required. Such phase-shifting should be performed under control of the system computer and must be independent of each excitation pulse signal (typically in both a decoupler channel and an observer channel), as each signal must have the capability to be set with its own phase and timing characteristics. While some of the desired characteristics might be achievable by radio-frequency (RF) phase-shifting of either, or both, of the excitation RF signal (after amplitude modulation in the transmitter) and the response RF signal (prior to demodulation in the receiver), it is desirable to provide one of four quadrants of phase shift to the "audio" baseband signals modulating the RF excitation signal and to the "audio" baseband signals recovered from the response signal, to assure that desired procedures (such as multiple-quantum experiments) can be carried out.

BRIEF SUMMARY OF THE INVENTION

In accordance with the invention, novel apparatus for shifting the phase of a phase-quadrature signal pair, in at least one of the transmitter and receiver of an NMR system, comprises: means for shifting the phase of each of the pair of signals by a substantially similar amount responsive to a control signal; and means for programmably establishing the control signal to provide a desired phase shift in said shifting means. Typically, the control signal is of digital data nature and the shifting means operates to shift phase through an angle equal to a selected multiple N of a basic angle. The basic angle is selected such that a plurality of equal angle increments are established by the resolving properties of the data signal. Thus, a (D=2) 2-line control data bus can provide $X=2^D=$four different combinations and the shifting means should operate in increments of $(2\pi/X=90°)$. A plurality of shifting means can be controlled by a single establishing means; if the latter means is a B=8 bit microcontroller, and only D=2 data lines are needed by each shifting means, then (B/D=4) different shifting means can be controlled by that one establishing means.

In a presently preferred embodiment, separate shifting means are used in each of the excitation and reception channels of the system, to provide a programmable sequence of up to 512 steps of any one of four different phase shifts for each of: (a) the pair of video baseband signals used to modulate the species carrier signal in the transmitter; (b) the pair of video baseband signals recovered from the response signal demodulated in the receiver; (c) both pairs of signals; and still provide capability for phase control of additional channels.

Accordingly, it is one object of the present invention to provide novel baseband video signal phase-shift apparatus for use in an NMR imaging system.

This and other objects of the present invention will become apparent upon a reading of the following detailed description of the invention, when considered in conjunction with the drawings.

BRIEF DESCRIPTION OF THE DRAWINGS

FIG. 1a is a graph illustrating the process for shifting, in 90° increments, the phase of a quadrature-phase pair of analog signals;

FIG. 1b is a schematic block diagram of one presently preferred embodiment of a phase-shift circuit for use in the apparatus.

DETAILED DESCRIPTION OF THE INVENTION

Figure 1:
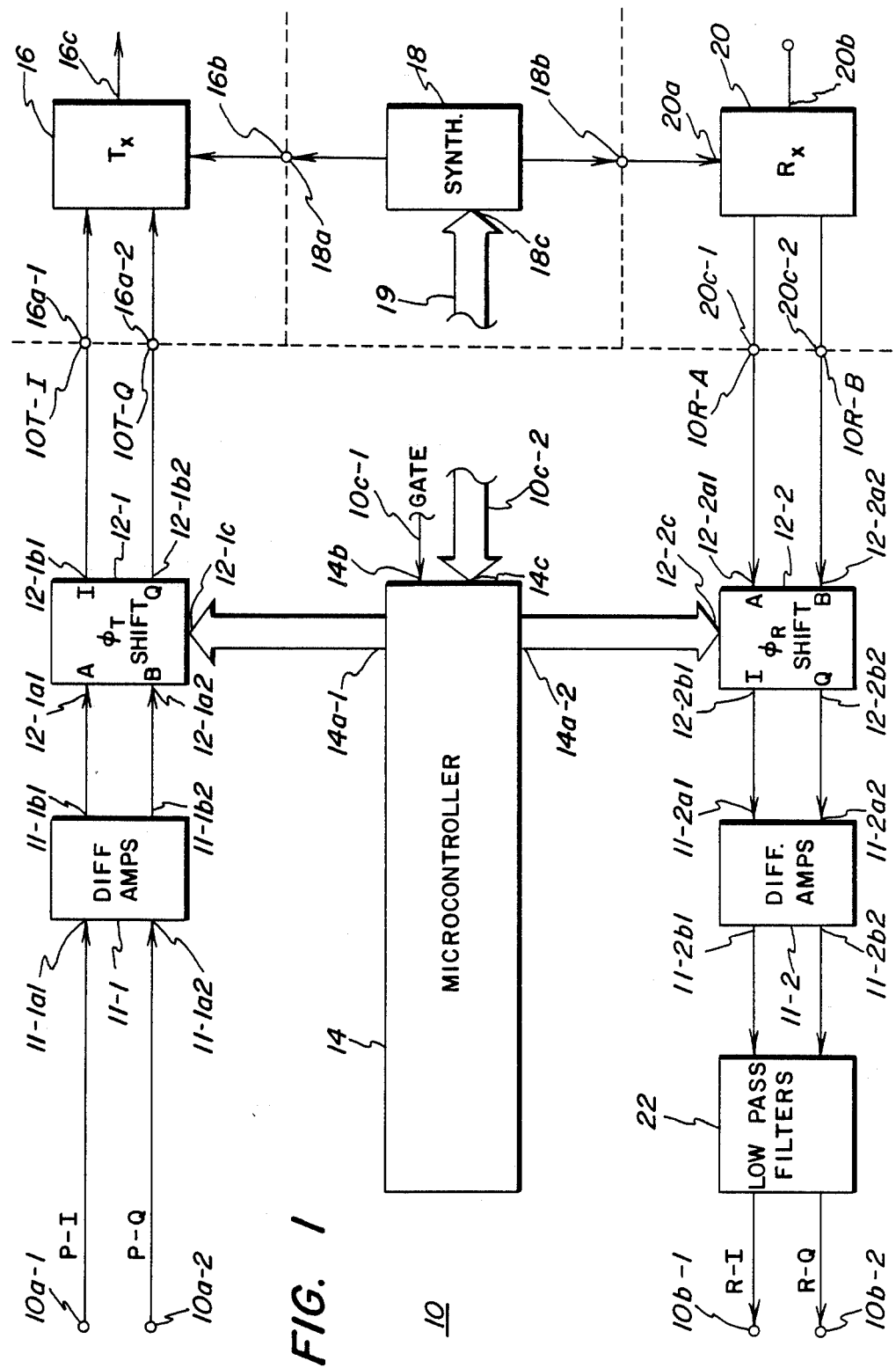
FIG. 1 is a schematic block diagram of a presently preferred embodiment of the apparatus of the present invention.

Referring initially to FIG. 1, a presently preferred embodiment 10 of our novel apparatus is utilized for varying, or shifting, the phase, to a reference phase, of a pair of first and second signals relative to a reference phase utilized in the excitation of a sample, and for varying the phase of another pair of signals relative to a reference phase utilized in the analysis of the response signal from that sample, in a nuclear magnetic resonance (NMR) system. Apparatus 10 receives at least one pair of analog signals, typically having components from DC up through some video frequency; each pair of these baseband signals is utilized to eventually establish the characteristics of the pulsed envelope of an associated RF signal to be used for exciting nuclei in the sample to be investigated. A first excitation channel video input 10a-1 receives the pulse-characteristic in-phase signal P-I, while a second excitation channel video input 10a-2 receives the pulse characteristic quadrature-phase signal P-Q. Each signal is provided to its own input 11-1a1 or 11-1a2, respectively, of a first differential amplifier-buffer means 11-1. The differential amplifiers 11-1 are utilized to provide substantially constant loading of the inputs 10a, at all video frequencies, to minimize distortion of the excitation signal modulation waveforms received thereat. Each of the buffered in-phase A signal or the buffered quadrature-phase B signal is individually provided at the associated one of the respective differential amplifier outputs 11-1b1 or 11-1b2, for coupling to the associated one of a first A input 12-1a1 or a second B input 12-1a2 of a transmission channel phase-shifting $\phi_T$ means 12-1. Means 12-1 provides a first output signal I at a first output 12-1b1 and a second output signal Q at a second output 12-1b2; this pair of signals is always in phase-quadrature with one another. The I and Q signals are shifted in phase by integer multiples of a fixed shift angle (e.g. a shift angle of 90°) such that the phase shift of the respective I or Q output signal, with respect to a reference phase of the respective input A or B signal, can be selected to be an integer N multiple of the basic fixed angle (e.g. to be at 0°, 90°, 180° or 270°) responsive to phase-shift information provided to the phase-shift means control input port 12-1c. This phase-shift control information is provided from a first control output port 14a-1 of a microcontroller means 14. The control signals at port 14a-1, as well as at other control output ports 14a-2, ..., is controlled responsive to a trigger, or GATE, signal provided via a first system bus portion 10c-1, to a first microcontroller input port 14b, and by other signals provided over additional system bus 10c-2, to a second microcontroller input port 14c. The phase-shifted I and Q output signals are respectively provided at the phase-shift apparatus excitation channel outputs 10T-I and 10T-Q.

The I and Q signals are respectively provided to the first and second quadrature-phase modulation input terminals 16a-1 and 16a-2 of an NMR imaging system spectrometer excitation transmitter Tx means 16. The excitation means also receives an RF signal, at a carrier input 16b, having the proper frequency $\omega$, established by the Larmor relationship $\omega = \gamma B_O$, where $\gamma$ is the gyromagnetic constant for the particular nuclear species to be stimulated by the modulated RF signal at the transmitter output 16c, and $B_O$ is the magnitude of the static main magnetic field in which the sample is to be located during the investigation. The carrier frequency $\omega$, of first and second signals at respective first and second outputs 18a and 18b of a frequency synthesizer means 18, is set responsive to digital data received at a frequency-control input port 18c, from a data bus 19 which is part of the general system data bus structure (which also includes the gate triggering channel signals on bus portion 10c-1 and the digital data signals on bus portion 10c-2).

The carrier frequency signal at second output 18b is applied to a first, or local oscillator, input 20a of an NMR response signal receiver Rx means 20. Means 20 receives the actual response signal at an input 20b, from a reception antenna, preamplifier and the like means, themselves well known to the art. Receiver 20 separates each of at least one response signal into first and second quadrature-phased portions, made separately available at a first output 20c-1 and a quadrature-phased second output 20c-2. These first and second demodulated video baseband signals therefore appear at the apparatus reception channel first and second inputs 10R-A and 10R-B, for connection to the associated one of a pair of inputs 12-2a1 or 12-2a2 of a reception channel phase-shifting $\phi_R$ means 12-2. The quadrature-phased input A and B signals are shifted to provide an in-phase I signal at a first means output 12-2b1 and a quadrature-phased Q received output signal at a second output 12-2b2. The input A and B signals are, illustratively, equally shifted by an integer multiple N of a phase-shift increment to provide the I and Q signals respectively. The increment multiplier N (where N=0, 1, 2, 3, ...) is established responsive to the control data provided at a $\phi_R$ shift means control input terminal 12-2 from a second microcontroller means output port 14a-2. Thus, the quadrature-phased signals appearing at 11-1a1 and 11-1a2 are phase shifted by a selected one of 0°, 90°, 180° or 270° to provide the quadrature-phased signals at outputs 12-1b1 and 12-1b2. The I and Q output signals are respectively provided to the associated one of input 11-2a1 or input 11-2a2 of a second differential amplifier-buffer means 11-2. The pair of differential amplifiers 11-2 provides constant loading of the $\phi_R$ shift means output signals. After buffering/amplification, the respective I and Q response baseband signals appear at the associated one of amplifier outputs 11-2b1 or 11-2b2. These signals are respectively low-pass filtered in a pair of substantially similar lowpass filters 22, to provide the respective recovered in-phase signal R-I at a first reception channel output 10b-1 and the recovered quadrature-phase signal R-Q at a second reception channel output 10b-2.

Referring now to FIG. 1a, we presently prefer to shift the phase of the analog video baseband signals A and B in N×90° increments, where N=0, 1, 2, 3, .... As phaseshift increments of 90° only are required, we phase shift an input quadrature signal pair by (1) inversion of each of the two input signals to obtain four signals (A, $\overline{A}$, B and $\overline{B}$) and (2) selection of the appropriate pair of those signals to provide the I and Q signals. This result can be summarized, in tabular fashion, as:

| Phase Shift | Output I | Output Q |
| --- | --- | --- |
| 0° | A | B |
| 90° | $\overline{B}$ | A |
| 180° | $\overline{A}$ | $\overline{B}$ |
| 270° | B | $\overline{A}$ |

In this case, the four phases behave as group operators; any phase operation in this group can be duplicated by combining other phase operations. If the I and Q output signals are swapped, an orthogonal operator group is obtained. If outputs I and Q are inverted, the operator group is maintained, but the definitions of phase shift are altered. By shifting the phase, the resulting image display can be inverted with respect to either display direction, e.g. assuming a standard spin-warp NMR imaging experiment, exchanging the I and Q recovered response audio signals results in a displayed image which is inverted with respect to the readout gradient direction, while an inversion of each of the I and Q signals, i.e. the use of $\bar{I}$ and $\bar{Q}$ signals, causes the image to be inverted with respect to the orthogonal, phase-encoding direction. This quadrant-shifting arrangment is further illustrated in FIG. 1a, wherein the abscissa 24 represents the in-phase output signal and the ordinate 25 represents the quadrature-phase output signal. If the quadrature-phase input signals A and B are maintained with their original phase, as shown by output signals 26, a 0° rotation has been performed between the input A and B signals to realize the output I and Q signals; combining the original B input signal with the $\bar{A}$ signal (the inversion of the A input signal) provides a pair of output signals 27 having a 90° phase shift; providing the A-inverted $\bar{A}$ signal on the I channel and the B-inverted $\bar{B}$ signal on the Q channel provides output signals 28 which are 180° out-of-phase with the input signals; and providing signals 29 using the $\bar{A}$ input signal routed to the I output and the $\bar{B}$ input signal at the Q output provides a pair of signals 29 with a 270° phase shift with respect to the original signals 26.

Referring now to FIG. 1b, one embodiment of a phaseshift means 12 for providing a N×90° phase-shift function, is shown. Means 12 receives the first A input signal at a first input 12-a1, and receives the second B input signal at a second input 12-a2. The I signal is to be provided at a first output 12-b1, while the Q signal is to be provided at a second output 12-b2, both with a phase shift, with respect to the reference phase of the input signals, as determined by the state of first and second control input data lines C0 and C1, at the control input port 12-c. Each input 12-a1 or 12-a2 is connected to the inputs 30-1a and 30-2a or 30-3a and 30-4a, respectively, of a pair of buffer means 30-1 and 30-2 or 30-3 and 30-4. Each buffer means has a gain substantially equal to 1, with the polarity of the signal at the associated outputs 30-1b and 30-2b or 30-3b and 30-4b being established responsive to the closing (for inversion) or opening (for non-inversion) of an associated polarity-control switch 30-1c, 30-2c, 30-3c or 30-4c. The switch disconnects or connects, respectively, a first non-inverting +input 32a of an operational amplifier 32, respectively for providing the output signals as the non-inversion or inversion of the input signal. With switch 30-1c closed, a first input resistance 33a appears in parallel with the input, while the operational amplifier input 32a is maintained at ground potential; with the switch 30-1c open, the resistance 33a is effectively in series between the input 30a and the now-floating operational amplifier input 32-1a. A second input resistance 33b is coupled between the input 30-1a and a second, inverting −input 32b of the operational amplifier of the associated buffer means. A feedback resistance 34 is coupled between the second input 32b and the buffer operational amplifier output 32c, which is also the buffer means output 30-1b. Each individual one of the plurality of buffer means has its output 30b connected to an associated one of a like plurality of amplitude-setting means 36-39, each providing a plurality of signals of settable amplitude.

First buffer means 30-1, having its switch 30-1c in the "open" condition, provides an output 30-1b signal which is substantially equal to the associated input signal A. A first level-establishment network 36 receives the A signal at an input, at one end of a fixed resistance element 36a, and provides first and second samples of this signal as signals A' and A", at the amplitude-controlling outputs of setting potentiometers 36b and 36c, respectively. Second buffer means 30-2 has the associated switch 30-2c thereof closed, whereby the signal at its output 30-2b is substantially the inverse ($\bar{A}$) of the input signal A. The inverse ($\bar{A}$) signal is provided to the input of a second network 37, at one end of a fixed resistance element 37a; first and second portions $\bar{A}'$ and $\bar{A}''$ of this signal are provided at respective arms of respective potentiometers 37b and 37c, respectively, of network 37. Similarly, B' and B" signals are provided at the outputs of network 38, while $\bar{B}'$ and $\bar{B}''$ signals are provided at the outputs of network 39. These eight signals are provided to the eight contacts of a first portion 41 of a switching means 40. First portion 41 comprises four double-pole, double-throw switch sections 41-1a, 41-1b, 41-2a and 41-2b. The position of the switches is illustratively in the upward condition responsive to a low, or logic 0, condition signal at the control line C0 input and is in the downward condition responsive to a high, or logic 1, condition signal at the C0 input. The output of the common terminals of switch sections 41-1a and 41-1b are connected to first and second selectable contacts of a second switch means portion first section 42-1, while the common terminals of switch portions 41-2a and 41-2b are connected to the selectable terminals of a second switch means portion second section 42-2. The state of switch portions 42 is controlled by the logic level on command line C1; the switches 42 are in a first, or upward, position responsive to a low logic level on line C1 and are in the downward position responsive to a high logic level on that line. Thus, dependent upon that one of the four possible combinations of levels on the C0-C1 lines at control input 12-c, the appropriate ones of the A, $\bar{A}$, B or $\bar{B}$ signals will be provided to respective buffer inputs 44-1a and 44-2a of first and second output buffer means 44-1 or 44-2, respectively.

The first output buffer means 44-1 utilizes another operational amplifier 46, having the non-inverting +input 46a thereof connected to output buffer amplifier input 44-1a. The other, inverting −input 46-b is connected to ground potential through a first gain setting resistance 47a, of magnitude $R_1$, and is connected through a second gain-setting resistance 47b, of magnitude $R_2$, to the operation amplifier output 46c, at the I output 12-b1 of the phase-shift means. The second output buffer 44-2 utilizes another operational amplifier 48 having its first, noninverting +input 48a connected to second output buffer input 44-2a. The other inverting- −input 48b is connected through a first gain-setting resistance 49a, of magnitude $R_1$, to ground potential and is connected through the series arrangement of a fixed resistance 49b, of fixed magnitude $R_2'$, and a variable resistance 49c, of variable magnitude $R_2''$, to the output 48c of the operational amplifier, itself connected to the Q output 12-2b of the phaseshift means. It will be seen that the total of resistances 49b and 49c can be established to cause the second output buffer means 44-2 to have the same non-inverting gain magnitude as the non-inverting gain magnitude of the first output buffer means 44-1. Thus, the I and Q output signals can be provided with magnitudes responsive to the magnitudes of the input signals A and B, and with phases shifted in multiples of 90° from the phases of input signals A and B, responsive to digital control signals at control input 12-c.

Figure 1C:
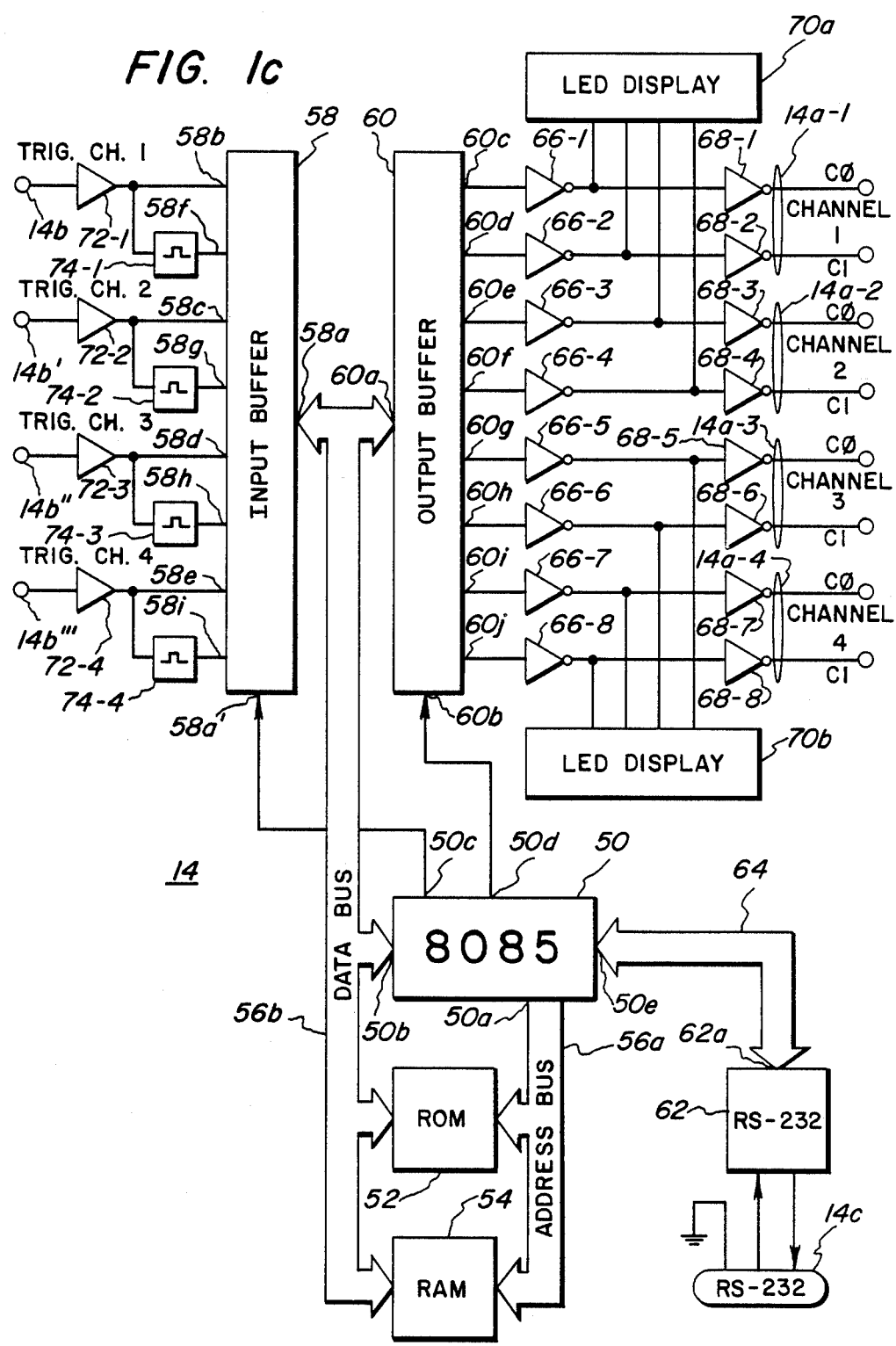
FIG. 1c is a schematic block diagram of one embodiment of a microcontroller suitable for use in the phase-shift apparatus.

Referring now to FIG. 1c, the microcontroller portion 14 of the phase-shift apparatus is shown in greater detail. For purposes of illustration, the microprocessor 50, utilized in this microcontroller, is the type 8085 single-chip microprocessor available from Intel Corp. and the like. Microprocessor 50 operates in conjunction with read-only memory (ROM) 52 (containing the microprocessor operating program in non-volatile stored manner) and with random-access, or volatile, memory (RAM) means 54. An address bus structure 56a originates at an address port 50a of the microprocessor, and supplies addresses to ROM means 52 and RAM means 54. A data bus structure 56b is connected between the data port 50b of the microprocessor, the data ports of ROM means 52 and RAM means 54, and the data ports 58a and 60a of input and output buffer means 58 and 60, respectively. The input buffer is enabled responsive to an enable signal at an enable input 58a', from an input-enable output 50c of the microprocessor; similarly, output buffer 60 is enabled responsive to an enable signal at an enable input 60b, from an output-enable output 50d of the microprocessor. While the control program (such as the exemplary program listed in hexadecimal object code in the Appendix of the specification) is fixed in ROM means 52, the actual programmable phase sequences for a particular use are programmed by entering a series of 2-bit numbers (i.e. numbers between decimal 0 and decimal 3) having bit patterns corresponding to the C0-C1 control lines for each phase-shift means 12.

In the present embodiment utilizing 4K of RAM, a phase sequence of up to 512 steps can be stored. The associated operating program is based upon the use of the 8085 with port A being the output port, port B being the input port, register B being the output port mask and memory locations 20B0–20B3 being used for the respective X, R, D and G data pointers. This program (as listed in the Appendix) also uses memory locations 20B4–20BB for the maximum data entries for the X, R, D and G parameters, while memory locations 20B5–20BC are utilized for the data counters for the same respective parameters; the subroutines for those parameters respectively start at locations 2844, 2878, 28AE and 28E3. At the final step in a phase program, the microprocessor program counter is automatically returned to the first step of the program phase sequence presently loaded into RAM means 54.

The phase program sequence is entered into RAM means 54 storage through the microprocessor 50, via a standard communications channel, forming at least a part of the data bus 10c-2 at input port 14c. In our illustrative embodiment, this is an RS-232 bidirectional data interface utilizing an RS-232 transceiver means 62 having a data port 62a which is in communications with a data port 50e of the microprocessor, via bus 64, in a manner well know to the data communications arts.

The number of output channels is determined by the size of the output buffer, which generally contains the same number of bits as the data word in the microprocessor, and by the number of bits required to control each phase-shift means 12; for the illustrated 8-bit data word microprocessor 50, an 8-bit output buffer means 60 is utilized, with the eight output lines 60c–60j each being individually buffered by first and second series-connected inverters 66-1 through 66-8 and 68-1 through 68-8, before being divided up into four output channel control ports 14a-1 through 14a-4, each containing a C0 line and a C1 line. A pair of 4-bit light-emitting-diode displays 70a and 70b are connected so that the status of each of the eight output lines can be visually monitored by operating personnel, if desired. It will be seen that, even though the phase control apparatus 10 of FIG. 1 appears to only require the use of first and second channel output ports 14a-1 and 14a-2, an additional two channels (third channel output port 14a-3 and fourth channel output port 14a-4) are provided; the use of a dual channel transmitter 16 may require a third phase control channel for a species-suppression transmitter, while a second receive channel or additional species suppression transmitters may be controlled with the remaining channel(s).

The phase control data, sent to each output channel port 14a, is responsive to whichever step of that channel's phase program is then currently activated. The phase sequence program for each of the four channels can be separately advanced, or even restarted, by means of the associated one of a plurality of channel gates, or triggers, at inputs 14b, 14b', 14b'', 14b''', . . . utilized with input buffer 58. Each of the resulting four-channel inputs is separately buffered by a non-inverting buffer means 72-1 through 72-4, providing a first channel input to the first-, third-, fifth- and seventh-stage inputs 58b–58e of the input buffer. In the event that the channel trigger transitions are insufficiently fast to be recognized at the associated one of inputs 58b–58e, each buffered trigger channel input is operated upon by a threshold detector means 74-1 through 74-4, respectively. The threshold-detected channel trigger signal is made available at the associated channel input of one of the second-, fourth-, sixth- and eighth-stage inputs 58f–58i. Thus, one of the four stored-phase programs can be stepped whenever an input channel trigger pulse is received with a duration of between about 25 and about 50 microseconds. Therefore, the four independent channels can be consecutively advanced by one step in as little as 200 microseconds (allowing up to 5000 phase changes per second to be completed for all four channels). Further, a phase program can be restarted by applying a long pulse, e.g. a pulse having a duration of greater than about 100 milliseconds, to the input. The channel trigger is stored in the appropriate portion of the input buffer means 58, and is read therefrom, onto data bus 56b, responsive to the input buffer enablement signal being received, from the microprocessor, at input 58b. The microprocessor, when appropriately triggered, provides the necessary phase selection information to the appropriate area of the output buffer 60, which information is latched within the output buffer responsive to an enabling level at input 60b (from associated microprocessor output 50d); the latched data is then made available at the actual channel output 14a.

Apparatus for programmably shifting the phase of transmitter and receiver analog baseband signals in a nuclear magnetic resonance imaging system, has been described with respect to a presently preferred embodiment thereof. Many modifications and variations will now become apparent to those skilled in the art. It is our intent, therefore, to be limited only by the scope of the appending claims and not by the specific details and instrumentalities presented by of explanation herein of our invention.

90°, responsive to a common phase angle control signal, each shifted phase signal being coupled as the analog output signal to an associated one of said first second output means, said shifting means comprising: means for providing a signal $\overline{A}$ which is the polarity inverse of the first input means signal A and for providing another signal $\overline{B}$ which is the polarity inverse of the second input means signal B; and means for selecting a first one and a different second one of the resulting A, $\overline{A}$, B and $\overline{B}$ signals for the signal at the first output means and at the second output means, respectively; and means for programmably establishing the control signal to provide a desired phase-shift angle for both of said pair of signals in said shifting means.

2. The apparatus of claim 1, wherein each of said signal pair is a baseband video signal.

3. The apparatus of claim 1, wherein the first output means I signal and the second output means Q signal are selected, responsive to a selected one of said increments, in accordance with

| INCREMENT | I | Q |
|---|---|---|
| 0° | A | B |
| 90° | B | $\overline{A}$ |
| 180° | $\overline{A}$ | $\overline{B}$ |
| 270° | $\overline{B}$ | A |

4. The apparatus of claim 1, wherein a separate shift-

| APPENDIX - HEX CODE: OPERATING PROGRAM | | | | | | | | | | | | | | | | |
|---|---|---|---|---|---|---|---|---|---|---|---|---|---|---|---|---|
| BASE ADDRESS + | 00 | 01 | 02 | 03 | 04 | 05 | 06 | 07 | 08 | 09 | 0A | 0B | 0C | 0D | 0E | 0F |
| 2090 | 21 | BB | 20 | 35 | 7E | C6 | 00 | CA | A5 | 20 | DB | 01 | 17 | D2 | AB | 20 |
| 20A0 | 21 | B3 | 20 | 36 | 00 | 21 | BA | 7E | 23 | 77 | 7A | C3 | 40 | 28 | | |
| 2800 | 31 | C2 | 20 | 3E | FF | D3 | 02 | 3E | 00 | D3 | 03 | D3 | 00 | 47 | 21 | B0 |
| 2810 | 20 | 77 | 23 | 77 | 23 | 77 | 23 | 77 | 23 | 7E | 23 | 77 | 23 | 7E | 23 | 77 |
| 2820 | 23 | 7E | 23 | 77 | 23 | 7E | 23 | 77 | DB | 01 | 1F | 57 | DA | 44 | 28 | 1F |
| 2830 | 1F | 57 | DA | 78 | 28 | 1F | 1F | 57 | DA | AE | 28 | 1F | 1F | DA | E3 | 28 |
| 2840 | C3 | 28 | 28 | XX | 3E | FC | A0 | 47 | 21 | B0 | 20 | 6E | 7E | E6 | 03 | B0 |
| 2850 | 47 | D3 | 00 | 21 | B0 | 20 | 34 | 21 | B5 | 20 | 35 | 7E | C6 | 00 | CA | 6D |
| 2860 | 28 | DB | 01 | 1F | 1F | D2 | 73 | 28 | 21 | B0 | 20 | 36 | 00 | 21 | B4 | 20 |
| 2870 | 7E | 23 | 77 | 7A | C3 | 2F | 28 | XX | 3E | F3 | A0 | 47 | 21 | B1 | 20 | 6E |
| 2880 | 7E | E6 | 0C | B0 | 47 | D3 | 00 | 21 | B1 | 20 | 34 | 21 | B7 | 20 | 35 | 7E |
| 2890 | C6 | 00 | CA | A3 | 28 | DB | 01 | 1F | 1F | 1F | 1F | D2 | A9 | 28 | 21 | B1 |
| 28A0 | 20 | 36 | 00 | 21 | B6 | 20 | 7E | 23 | 77 | 7A | C3 | 35 | 28 | XX | 3E | CF |
| 28B0 | A0 | 47 | 21 | B2 | 20 | 6E | 7E | E6 | 30 | B0 | 47 | D3 | 00 | 21 | B2 | 20 |
| 28C0 | 34 | 21 | B9 | 20 | 35 | 7E | C6 | 00 | CA | D8 | 28 | DB | 01 | 17 | 17 | 17 |
| 28D0 | D2 | DE | 28 | 21 | B2 | 20 | 36 | 00 | 21 | B8 | 20 | 7E | 23 | 77 | 7A | C3 |
| 28E0 | 3B | 28 | XX | 3E | 3F | A0 | 47 | 21 | B3 | 20 | 6E | 7E | E6 | C0 | B0 | 47 |
| 28F0 | D3 | 00 | 21 | B3 | 20 | 34 | C3 | 90 | 20 | | | | | | | |

What is claimed is:

1. Apparatus for shifting the phase of each of a pair if pahse-quadrature analog input signals, in at least one of a transmitter and a receiver of a nuclear magnetic resonance (NMR) system, comprising:

first and second input means each for receiving a different one of apair of quadrature-phased analog-input signals A and B;

first and second output means each for providing a location at which an associated one of a pair of phase-shifted analog output signals will be provided;

means for shifting the phase of that one analog input signal received at the associated one of each of said first and second input means by a substantially similar phase angle in an identical one of four phase-shift increments each substantially equal to ing means is provided in each of the transmitter and received of said NMR system.

5. The apparatus of claim 4, wherein the first outputs means I signal and the second output means Q signal of each shifting are selected, responsive to a selected one of said increments, in accordance with

| INCREMENT | I | Q |
|---|---|---|
| 0° | A | B |
| 90° | B | $\overline{A}$ |
| 180° | $\overline{A}$ | $\overline{B}$ |
| 270° | $\overline{B}$ | A |

6. Apparatus for shifting the phase of each of a pair of phase-quadrature analog input signals, in each of a trasmitter and a receiver of a nuclear magnetic resonance (NMR) system, comprising:
- first and second input means each for receiving a different of the pair of phase-quadrature analog input signals,
- first and second output means each for providing a location at which an associated one of a pair of phase-shifted analog output signals will be provided;
- separate means in each of said transmitter and said receiver for shifting the phase of that one analog input signal received at the associated one of each of said first and second input means by a substantially similar phase angle responsive to a common phase-angle control signal, each shifted-phase signal being coupled as the analog output signal to an associated one of said first and second output means;
- means for programmably establishing the control signal to provide a desired phase-shift angle for both of said pair of signals in each of said shifting means; and
- at least one additional phase-shifting means, each programably controlled by said establishing means, for providing at least one additional phase-shifting channel in at least one of said transmitter and said receiver.

7. Apoaratus for shifting the phase of each of a pair of phase-quadrature analog input signals, in each of of a transmitter and a receiver of a nuclear magnetic resonance (NMR) system, comprising:
- first and second input means each for receiving a different of the pair of phase-quadrature analog input signals;
- first and second output means each for providing a location at which an associated one of a pair phase-shifted analog analog output signals will be provided;
- differential means for buffering each of the pair of input signals in the transmitter channel;
- separate means in each of said transmitter and said receiver for shifting the phase of that one analog input signal received at the associated one of each of said first and second input means by a substantially similar phase angle responsive to a common phase-angle control signal, each shifted-phase signal being coupled as the analog output signal to an associated one of said first and second output means.
- differential means for buffering each of the pair of phase-shifted signals in the receiver channel;
- means for low pass filtering the pair of buffered signals in the receiver channel; and
- means for programmably establishing the control signal to provide a desired phase-shift angle for both of said pair of signals in each of said shifting means.

8. Apparatus for shifting the phase of each of pair of phase-quadrature analog input signals, in at least one of a transmitter and a received of a nuclear magnetic rsonance (NMR) system, comprising:
- first and second input means each for receiving a different one of the pair of phase-quadrature analog input signals,
- first and second output means each for providing a location at which an associated one of a pair of phase-shifted analog output signals will be provided;
- means for shifting the phase of that one analog input signal received at the associated one of each of said first and second input means by a substantially similar phase angle responsive to a common phase-angle control signal, each shifted-phase signal being coupled as the analog output signal to an associated one of said first and second output means; and
- means for programmably establishing the control signal to provide a desired phase-shift angle for both of said pair of signals in said shifting means, and comprising: microprocessor means for directing each of at least one associated phase-shifting means to a designated one of N different phase shifts therethrough; random-access memory (RAM) means for storing at least one sequence of phase-shift instructions to be carried out by the microprocessor means; and rear-only memory (ROM) means for fixedly storing an operating program allowing said at least one phase-shifting sequence to be stored in said RAM means and for causing said microproessor means to carry out said sequence.

9. The apparatus of claim 8, wherein said controlling means further comprises: input buffer means for accepting at least one trigger signal for advancing at least one of the phase-shift-control sequences to a next subsequent instruction thereof; and an output buffer means for providing phase-shift instruction data, associated with said next-subsequent instruction, to each of the phase-shifting means.

10. The apparatus of claim 9, wherein each of a plurality of shifting means can be controlled over a separate control channel from said microcontroller, and the number of control channels is at least equal to the quotient of a number B of parallel bits in each instruction processed by said microprocessor means, and a number C of bit control lines required for each phase-shifting means control channel.

11. The apparatus of claim 10, wherein the input buffer means and output buffer means each support the same number of control channels.

12. The apparatus of claim 11, wherein said input buffer means further comprises at least one means for providing a thresholding trigger on at least one associated control channel input.

* * * * *